(12) United States Patent
Morito

(10) Patent No.: US 6,487,007 B1
(45) Date of Patent: Nov. 26, 2002

(54) POLARIZATION INDEPENDENT-TYPE SEMICONDUCTOR OPTICAL AMPLIFIER

(75) Inventor: Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

(21) Appl. No.: 09/585,323

(22) Filed: Jun. 2, 2000

(30) Foreign Application Priority Data

Jun. 3, 1999 (JP) .......................................... 11-156109
May 29, 2000 (JP) ...................................... 2000-158399

(51) Int. Cl.$^7$ .............................................. H01S 3/25
(52) U.S. Cl. ...................................................... 359/344
(58) Field of Search ........................... 359/344; 372/43, 372/44, 45, 46, 47, 48, 49, 50

(56) References Cited

U.S. PATENT DOCUMENTS

| | | | | |
|---|---|---|---|---|
| 4,952,017 A | * | 8/1990 | Henry et al. ............. | 350/96.15 |
| 5,090,790 A | * | 2/1992 | Zucker ........................ | 257/18 |
| 5,198,921 A | * | 3/1993 | Aoshima et al. ............ | 359/248 |
| 5,488,507 A | * | 1/1996 | Nishimura .................. | 359/344 |
| 5,982,531 A | * | 11/1999 | Emery et al. ............... | 359/344 |
| 6,075,254 A | * | 6/2000 | Shen et al. .................. | 257/18 |
| 6,175,446 B1 | * | 2/2001 | Alphonse .................... | 359/344 |
| 6,271,961 B1 | * | 8/2001 | Emery et al. ............... | 359/332 |
| 6,310,719 B1 | * | 10/2001 | Goldstein et al. ........... | 359/344 |

FOREIGN PATENT DOCUMENTS

| | | |
|---|---|---|
| JP | Hei. 11-046044 A | 2/1999 |
| JP | Hei 11-112073 A | 4/1999 |

OTHER PUBLICATIONS

Pleumeekers et al., "Relaxation Oscillations in the Gain Recovery of Gain–Clamped Semiconductor Optical Amplifiers: Simulation and Experiments", OSA TOPS vol. 161997, pp. 260–265.*, Yoshimoto et al., "4–channel Polarization–insensitive semiconductor optical amplifier (SOA) gate array integrated with spot–size converters", OSA TOPS vol. 16, 1997, pp. 266–269.*

Chen et al., "Two section semiconductor optical amplifier as optical power equalizer with high output power", Optical Amplifiers and Their Applications, 1998, pp. 138–140.*

Silver et al., 'Design and ASE Characteristics of 1550–nm Polarization–Insensitive Semiconductor Optical Amplifiers Containing Tensile and Compressive WELLs, IEEE Journal of Quantum Electronics, vol. 36, No. 1, Jan. 2000, pp. 118–122.*

Newkirk et al, "1.5 micrometer Multiquantum–Well Semiconductor Optical Amplifier with Tensile and Compressivleiy Strained Wells for Polarization–Independent Gain", IEEE Photonics Technology Letters, vol. 4, No. 4, Apr. 1993, pp. 406–408.*

(List continued on next page.)

*Primary Examiner*—Thomas H. Tarcza
*Assistant Examiner*—Deandra M. Hughes
(74) *Attorney, Agent, or Firm*—Armstrong, Westerman & Hattori, LLP.

(57) ABSTRACT

A polarization independent-type semiconductor optical amplifier comprises: a strained bulk active layer having a 20 nm to 90 nm-thick and having a tensile strain of a –0.10% to –0.60% strain amount; clad layers provided, sandwiching the strained bulk active layer; and a resonance suppressing means for suppressing resonance of light due to reflection on a light incident end face and a light exit end face of the strained bulk active layer, incident signal light entering at the light incident end face being amplified and exiting at the light exit end face, and an individual transmission gain of the exit signal light being substantially constant independent of a polarization state of the incident signal light. Whereby drastically increased fiber out saturation powers can be obtained with polarization independence retained.

6 Claims, 14 Drawing Sheets

OTHER PUBLICATIONS

P. Doussiere et al., IEEE Photon. Technol. Lett., vol. 6, pp. 170–172, Feb. 1994.

P. Doussiere et al., OAA '95, pp. 119–122, 1995.

K. Magari et al., IEEE J. Quantum Electron., vol. 30, pp. 695–702, Mar. 1994.

A.E. Kelly et al., Electron. Lett., vol. 32, pp. 1835–1836, Sep. 12, 1996.

A.E. Kelly et al., Electron. Lett., vol. 33, pp. 536–538 (1997), Mar. 13, 1997.

M.A. Newkirk et al., IEEE Photon. Technol. Lett., vol. 4, pp. 406–408, Apr. 1993.

A. Ougazzaden et al. Electron. Lett., vol. 31, pp. 1242–1244, Jul. 20, 1995.

D, Sigogne et al., ECOC '95, pp. 267–270, 1995.

D. Sigogne et al., Electron. Lett., vol. 32, pp. 1403–1405, Jul. 18, 1996.

J–Y Emery et al., ECOC '96, vol. 3, pp. 165–168, 1998.

J–Y Emery et al., Electron. Lett., vol. 33, pp. 1083–1084, Jun. 05, 1997.

* cited by examiner

POLARIZATION INDEPENDENT-TYPE SEMICONDUCTOR OPTICAL AMPLIFIER

BACKGROUND OF THE INVENTION

The present invention relates to a polarization independent-type semiconductor optical amplifier, more specifically to a polarization independent-type optical amplifier for use in wavelength division multiplexing (WDM) communication systems, which has large fiber out saturation powers in a small size and at low consumed electric power.

Recently, corresponding to the drastic increase of communication demand, wavelength division multiplexing systems for multiplexing signal light of a plurality of different wavelengths and transmitting the signal light concurrently in one optical fiber are progressively developed. Such wavelength division multiplexing system includes a number of optical parts for combining, switching and dividing optical signals, and the optical signals are attenuated due to losses in the respective optical parts.

Optical amplifiers are used for compensating such attenuation. A very larger number of optical amplifiers are required in comparison with a number of optical amplifiers used in the conventional optical fiber systems. It is required that the optical amplifiers are small sized and operable at low power consumption.

In addition, it is required that such optical amplifiers used in in-line have less polarization dependence of gains because polarization states of input signal lights are random, and have large fiber out saturation powers so as to have wide input dynamic ranges because fluctuations of power levels of input signal light are large.

Among such various optical amplifiers, semiconductor optical amplifiers (SOAs) are small sized and have small power consumption, and can be designed to be polarization-independent. The semiconductor optical amplifiers are expected to be a loss compensating optical amplifier suitably used in the wavelength division multiplexing systems.

Such polarization independent-type semiconductor optical amplifiers for a 1.55 $\mu$m-band in the wavelength band used in the fiber optical communication have been conventionally developed. Such polarization independent-type semiconductor optical amplifier will be explained below.

An internal gain is a gain of the optical amplifier itself. A fiber to fiber gain is a gain of a system as a whole including an optical amplifier provided between an optical fiber on the input side and an optical fiber on the output side with an optical system for optical coupling, such as a lens, etc., disposed therebetween, which takes into account a loss of the system between the exit end face of the input side optical fiber and the incidence end face of the output side optical fiber.

A chip out saturation power is a chip out power given when an internal gain is decreased by 3 dB. A fiber out saturation power is a fiber output power given when a fiber to fiber gain is decreased by 3 dB.

As a semiconductor optical amplifier using a strain-free bulk active layer, P. Doussiere et al., Alcatel have realized a device which includes a bulk active layer of a 430 nm-thick and a 500 nm-width, and which has, at 800 $\mu$m-device length and at 200 mA injection current, a below 0.5 dB inter-polarization gain difference, a 29 dB fiber to fiber gain and a +9.0 dB$_m$ fiber out saturation power (see, e.g., P. Doussiere et al., IEEE Photon. Technol. Lett., vol. 6, pp. 170–172, 1994 and P. Doussiere et al, OAA '95, pp. 119–122).

As a semiconductor optical amplifier using a strained Multiple Quantum Well (MQW) active layer formed of a strain-free well layer and an tensile strained barrier layer, Magari et al., NTT realized a device including a strained MQW layer which is formed of 10 well layers each having a 5 nm-thick and a 0% strain amount and 11 barrier layers each having a 5 nm-thick and a −1.7% strain amount, and is sandwiched between 50 nm-thick and 100 nm-thick separate confinement heterostructure (SCH) layers, and which has, at a 660 $\mu$m-device length and 200 mA injection current, a below 1.0 dB inter-polarization gain difference, a 27 dB internal gain (a 13 dB fiber to fiber gain), a +14.0 dB$_m$ chip out saturation power (a +7.0 dB$_m$ fiber out saturation power) (see, e.g., K. Magari et al., IEEE Photon. Technol. Lett., vol. 2, pp. 556–558, 1990, K. Magari et al., IEEE Photon. Technol. Lett., vol. 3, pp. 998–1000, 1991, and K. Magari et al., IEEE J. Quantum Electron., vol. 30, pp. 695–702, 1994).

As a semiconductor optical amplifier similarly using a strained MQW active layer formed of a strain-free well layer and a tensile strained barrier layer, A. E. Kelly, et al., BT realized a device including a strained MQW layer which is formed of 10 well layers of a 0% strain amount and 11 barrier layers of a −0.67% strain amount and is sandwiched between 25 nm-thick SCH layers, and which has, at a 2000 $\mu$m-device length and 200 mA injection current, a below 0.5 dB inter-polarization gain difference, a 27 dB fiber to fiber gain and a +7.5 dB$_m$ fiber out saturation power (see, e.g., A. E. Kelly et al., Electron Lett., vol. 32, pp. 1835–1836, 1996 and A. E. Kelly et al., Electron Lett., vol. 33, pp. 536–538, 1997).

As a semiconductor optical amplifier using a strained MQW active layer formed of a compressive strained quantum well layer, a tensile strained quantum well layer and a strain-free barrier layer, M. A. Newkirk et al., ATT realized a device including a strained MQW layer which is formed of 3 compressive strained quantum well layers each having a 3.5 nm-thick and a +1.0% strain amount, 3 tensile strained quantum well layers each having a 16.0 nm-thick and a −1.0% strain amount, and 7 barrier layers each having a 10 nm-thick and a 0% strain amount, and which has, at a 625 $\mu$m-device length and 150 mA injection current, a below 1.0 dB inter-polarization gain difference, a 13 dB internal gain (a 4.4 dB fiber to fiber gain) and a +11.1 dB$_m$ chip out saturation power (a +6.8 dB$_m$ fiber out saturation power) (see, e.g., M. A. Newkirk et al., IEEE Photon. Technol. Lett., vol. 4, pp, 406–408, 1993).

As a semiconductor optical amplifier using a strained MQW active layer formed of a compressive strained quantum well layer and a tensile strained barrier layer, D. Sigogne et al., CNET realized a device which includes a strained MQW layer formed of 16 compressive strained quantum well layers each having a 8 nm-thick and a +1.1% strain amount and 16 tensile strained barrier layers of a 7 nm-thick and a −0.9% strain amount, and which has, at a 940 $\mu$m-device length and 150 mA injection current, a below 1.0 dB inter-polarization gain difference, a 23 dB fiber to fiber gain and a +7.0 dB$_m$ chip out saturation power (a +3.5 dB$_m$ fiber out saturation power) (see, e.g., A. Ougazzaden et al., Electron. Lett., vol. 31, pp. 1242–1244, 1955, D. Sigogne et al., ECOC95, pp. 267–270, and D. Sigogne et al., Electron. Lett., vol. 32, pp. 1403–1405, 1996).

As a semiconductor optical amplifier using a tensile strained bulk active layer, J. Y. Emery et al., Alcatel realized a device which includes a 200 nm-thick bulk active layer sandwiched on both sides thereof by 100 nm-separate confinement heterostructure layers and having a −0.15% tensile strain at a 1.2 $\mu$m-active layer width, and which has, at a 1000 μm-device length and 200 mA injection current, a below 0.3 dB inter-polarization gain difference, a 29 dB fiber to fiber gain and a +9.5 dB$_m$ fiber out saturation power (see, e.g., J. Y. Emery et al., ECCO96, vol. 3, pp. 165–168 and J. Y. Emery et al., Electron. Lett., vol. 33, pp. 1083–1084, 1997).

Polarization independent-type semiconductor optical amplifiers of various active layer structures as described above have been studied. In such semiconductor optical amplifiers, in order to obtain a wide dynamic range it is required that a fiber out saturation power, which provides an upper limit of the dynamic range, is as large as possible. For example, for a semiconductor optical amplifier for 1.55 μm-band having polarization dependency, the MQW active layer structure can provide a +19.5 dB$_m$ chip out saturation power.

However, in the polarization independent-type semiconductor optical amplifier for 1.55 μm-band, even a maximum fiber out saturation power cannot exceed +9.5 dB$_m$ obtained by using the tensile strained bulk active layer of the above-described J. Y. Emery et al., Alcatel. The optical amplifier is inferior to the polarization dependent-type optical amplifier by even 7.5 dB, taking into account a 2.5 dB fiber coupling loss.

A cause for such low fiber out saturation powers of the polarization independent-type semiconductor optical amplifiers is that structural restrictions of the active layers imposed for the optical amplifiers to be polarization independent hinders high out saturation power.

In the case that the strain-free bulk active layer is used as in P. Doussiere et al., Alcatel, the active layer has rectangular section for making the optical confinement in the active layer polarization-independent. The lower limit of dimensions of the section of the active layer is 300 nm-square due to fabrication limitations. The upper limit is restricted to 600 nm-square due to conditions for maintaining fundamental modes. Freedom of design of the device is low.

In the case that the strained MQW layer is used, in order to nullify increased material gain for TE polarization light in the active layer due to the quantum effect and increased optical confinement for TE polarization light in the flat active layer, a large tensile strain must be used for increased material gain for TM polarization light.

However, in the case that such large tensile strain is used, because a gain peak wavelength is made shorter by both quantum effect and tensile strain effect, and also by band filling effect due to injection current increase, in order to obtain a necessary gain near a 1.55 μm-wavelength, a restriction that tensile strain is applied to the barrier layer, or the quantum well layer is made thick to depress the shortening of the wavelength due to the quantum effect is applied. Accordingly, a problem is that freedom of structural design for obtaining large fiber out saturation powers is much decreased.

Here, with reference to FIG. 14, the conventional polarization independent-type semiconductor optical amplifier using the tensile strained bulk active layer of Alcatel will be explained.

FIG. 14 is a diagrammatic perspective view of the conventional polarization independent-type semiconductor optical amplifier. In the forward half portion of the semiconductor optical amplifier, a p-type InP buried layer 37, proton-injection regions 38, 39, a p-type InGaAs contact layer 40 and a p-side electrode 42 are not shown so as to show the structure of the active layer. A spot size conversion region, a window region, etc., are left out of FIG. 14.

In this polarization independent-type semiconductor optical amplifier, 100 nm-thick InGaAsP separate confinement heterostructure layers (SCH layers) 33, 35 are provided on and the underside of a 200 nm-thick InGaAsP strained bulk active layer 34, and a stripe width is 1.2 μm.

The optical axis of the striped InGaAsP strained bulk active layer 34 intersects at a 7° inclination angle, a normal of the light input/output end faces.

This optical amplifier is so designed that the active layer which is as thick as 200 nm is used to make an optical confinement ratio between TE and TM polarization lights (TE/TM) small, whereby a required tensile strain is depressed to be as low as −0.15%. Resultantly, an inter-polarization gain difference can be small, whereby a signal input light 46 entering at one end face is amplified independent of polarization to be outputted as amplified output light 47.

Antireflection coating films (AR films) 44, 45 are provided on both end faces for suppressing resonance of the signal input light 46.

However, as described above, the polarization independent-type semiconductor optical amplifier using this tensile strained bulk active layer has a +9.5 dB$_m$ fiber out saturation power. This fiber out saturation power is still considerable low, even taking into account fiber coupling loss of 2.5 dB, in comparison with a +19.5 dB$_m$ chip out saturation power of a polarization dependent-type semiconductor optical amplifier.

In this polarization independent-type semiconductor optical amplifier using tensile strained bulk active layer, the tensile strained bulk active layer still has not a critical film thickness for strain relaxation, and accordingly a larger strain can be applied. Accordingly, the active layer structure is changed to thereby increase the chip out saturation power, whereby the fiber out saturation power can be increased.

SUMMARY OF THE INVENTION

An object of the present invention is to obtain increased fiber out saturation power without lessening structure design freedom, by making no inter-polarization gain difference while increasing output saturation power.

Means for achieving the object of the present invention will be explained with reference to FIGS. 1A and 1B. FIG. 1A is an upper side view, and FIG. 1B is a diagrammatic sectional view which is normal to the optical axis. In the drawings, reference numbers 1 and 6 represent a clad layer, reference number 4 indicates a striped mesa, and reference number 5 denotes a buried layer.

The polarization independent-type semiconductor optical amplifier according to the present invention is characterized in that the polarization independent-type semiconductor optical amplifier comprises: a strained bulk active layer 3 of a bulk crystal having a tensile strain introduced into, resonance of light due to reflection between a light incident end face 7 and a light exit end face 8 being depressed, an optical signal 9 being incident on the light incident end face 7, current being injected into the strained bulk active layer 3 to amplify the optical signal 9 by a stimulated emission effect, the amplified signal 10 exiting at the light exit end face 8, and a signal transmission gain of the amplified signal 10 being substantially constant, independent of a polarized state of the incident optical signal 9, in which a thickness of the strained bulk active layer 3 is 20 nm~200 nm, and a strain amount is −0.09%~−0.60%.

Thus, the strained bulk active layer 3 forming the polarization independent-type semiconductor optical amplifier has a thickness d of 20 nm~100 nm and a strain amount of −0.09%~−0.60%, whereby large output saturation power can be provided while polarization independence being retained.

That is, generally an output saturation power $P_s$ of a semiconductor optical amplifier is expressed by $$Ps=(w \times d/\Gamma) \times hv/(\tau \times a)$$

where a thickness of the strained bulk active layer 3 is d, a confinement factor is $\Gamma$, a photon energy is hv, a carrier lifetime is $\tau$, and a differential gain is a. A thickness d of the strained bulk active layer 3 is made small to make a confinement factor $\Gamma$ small, whereby a large mode cross section (w×d/$\Gamma$) is provided while, in addition, the effect of a higher carrier density reducing a carrier lifetime $\tau$ is provided, so as to provide a larger output saturation power.

On the other hand, the strained bulk active layer 3 is thinned and has a sectional configuration of higher flatness, whereby an optical confinement ratio between TE and TM polarization lights is high, and a required strain amount is larger. However, when the strained bulk active layer 3 has a thickness of 20 nm~100 nm, a strain amount is set to be −0.09%~−0.60%, whereby polarization independence can be retained.

When a thick strained bulk active layer 3 is sandwiched by thick separate confinement heterostructure layers 2, the optical confinement ratio between TE and TM polarization lights become smaller, whereby the strain amount required for polarization independence become smaller. In a case that the thickness of the strained bulk active layer 3 is 100 nm, in consideration of directing conditions of fundamental mode in a case that a stripe width is above 1 $\mu$m, it is possible that the strained bulk active layer 3 is sandwiched by the separate confinement heterostructure layers 2 of a 300 nm-thick and of a 1.2 $\mu$m composition ($\lambda_g$=1.2 $\mu$m). In this case, the strain amount of the strained bulk active layer 3 required for the polarization independence is −0.09%.

When a thin strained bulk active layer 3 is not sandwiched by separate confinement heterostructure layers 2, the optical confinement ratio between TE and TM polarization lights increases, whereby the strain amount required for polarization independence increases. In a case that the thickness of the strained bulk active layer 3 is 20 nm, the strain amount of the strained bulk active layer 3 required for the polarization independence is −0.60% when the strained bulk active layer 3 is not sandwiched by the separate confinement heterostructure layers 2.

As will be described later, an upper limit of the thickness of the strained bulk active layer 3 is set to be about 90 nm or about 80 nm, whereby better output saturation power can be provided. A lower limit of the strain amount in the case that a thickness of the strained active layer 3 is 90 nm is −0.10%, and in a case that a thickness of the strained active layer 3 is 80 nm, a lower limit of the strain amount is −0.11%.

One measure of a lower limit of the strained bulk active layer thickness is considered to be about 20 nm, because when the strained bulk active layer 3 is thinned, and the quantum effect is conspicuous, a material gain for TE polarization light is large.

As will be described later, a lower limit of the thickness of the strained bulk active layer 3 is set to be about 25 nm or about 30 nm, the quantum effect can be effectively depressed. A upper limit of the strain amount in the case that a thickness of the strained active layer 3 is 25 nm is −0.45%, and in a case that a thickness of the strained active layer 3 is 30 nm, a upper limit of the strain amount is −0.44%.

The present invention is also characterized in that, in the above-described polarization independent-type semiconductor optical amplifier, the strained bulk active layer is sandwiched by separate confinement heterostructure layers 2 disposed in a direction of thickness of the strained bulk active layer 3 and in contact with the strained bulk layer 3.

Thus, the strained bulk active layer 3 is sandwiched by the separate confinement heterostructure (SCH) layers 2, whereby a smaller optical confinement ratio between TE and TM polarization lights and a larger mode cross section (w×d/$\Gamma$) can be provided.

In this case, an optical axial direction of the strained bulk active layer 3 is inclined by 7–10° to a normal of the light exit end face 8, whereby light resonance due to reflection between the light incident end face 7 and the light exit end face 8 can be depressed. The semiconductor optical amplifier can be free generation of ripples in outputs.

In this case, it is preferable that a width of the strained bulk active layer 3 is tapered to gradually reduce the width at a ratio of above 1/1000 per a unit length toward the light exit end face 8 from the center of the device, whereby optical coupling efficiency with an optical system, such as optical fibers, etc. is improved.

When a 1.0 $\mu$m-width is reduced to a 0.6 $\mu$m-width over a 400 $\mu$m-length, the ratio is 1/1000 ((1.0 $\mu$m−0.6 $\mu$m)/400 $\mu$m).

Otherwise, it is possible that a thickness of the strained bulk active layer is tapered gradually toward the light exit end face 8 from the center of the device so that a thickness of the strained bulk active layer 3 at the end on the light exit end face 8 is below ½ of a thickness thereof at the center of the device. Higher optical coupling with an optical system, such as optical fibers can be provided.

It is preferable that the so-called window structure, in which the strained bulk active layer 3 is absent, but the clad layer is present, is provided over 20–50 $\mu$m from the light exit end face 8 on the light exit end face 8. Reflection of signal light 9 on the light exit end face 8 can be prevented, whereby generation of ripples in amplified signal light 10 can be prevented without failure.

DETAILED DESCRIPTION OF THE INVENTION

The polarization independent-type semiconductor optical amplifier according to an embodiment of the present invention will be explained with reference to FIGS. 2 to 13.

First, interrelationships between active layer thicknesses and output saturation power of the semiconductor optical amplifier, and interrelationships between active layer thicknesses and strain amounts for retaining polarization independence of the semiconductor optical amplifier will be explained with reference to FIGS. 2 to 6.

Generally, an output saturation power $P_s$ of a semiconductor optical amplifier is expressed by $$Ps=(w \times d/\Gamma) \times h\nu/(\tau \times a)$$

where an active layer width is represented by w, an active layer thickness is represented by d, an optical confinement factor is represented by $\Gamma$, photon energy is represented by $h\nu$, a carrier lifetime is represented by $\tau$, and a differential gain is represented by a.

Accordingly, means for increasing the output saturation power $P_s$ are considered to be (1) increasing a mode cross section (w×d/$\Gamma$), (2) decreasing a carrier lifetime $\tau$, and (3) decreasing the differential gain a. Then, it is discussed here in what manner the above-described three parameters which influence the output saturation power change when a thickness of the active layer is decreased.

First, (1) the active layer thickness dependence of the mode cross section will be discussed. A mode cross section is expressed by (w×d/$\Gamma$). However, an optical confinement factor $\Gamma$ of the denominator changes depending on a thickness d of the active layer. Thus, the active layer thickness dependence of d/$\Gamma$ must be considered. As the active layer is thinned, an optical field much spreads, and decrease ratios of the optical confinement factor $\Gamma$ become more outstanding. As a result, d/$\Gamma$ increases as the active layer thickness d decreases, and the mode cross section increases.

Figure 1A:
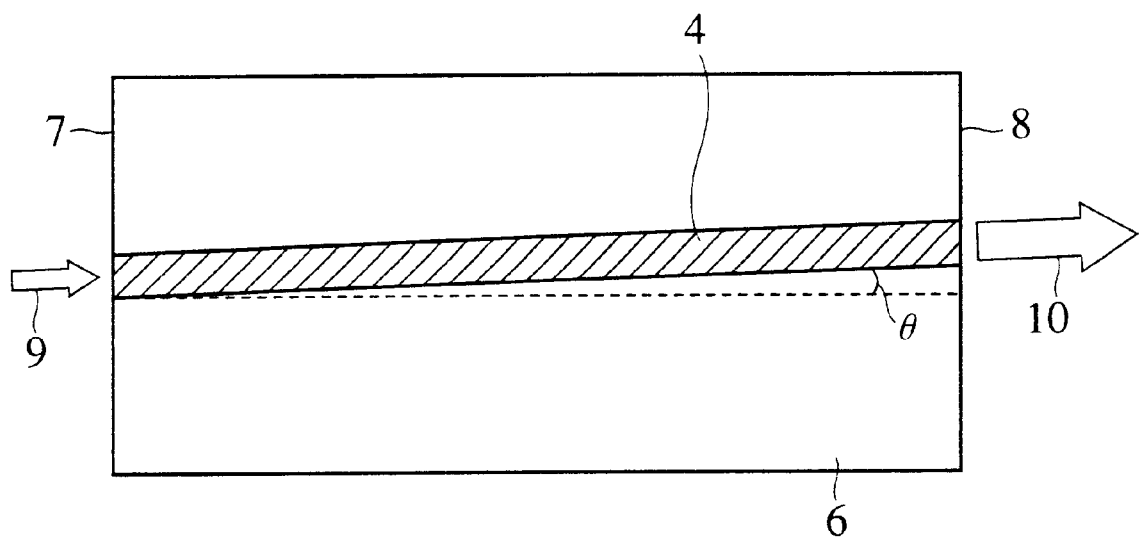
FIGS. 1A and 1B are views explaining a principle of the present invention.
Figure 1B:
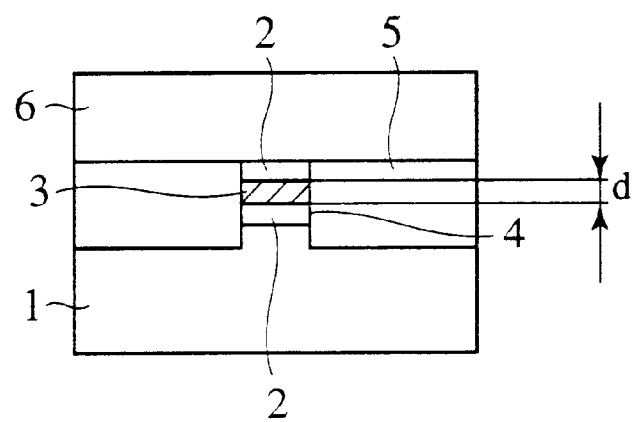
Figure 2:
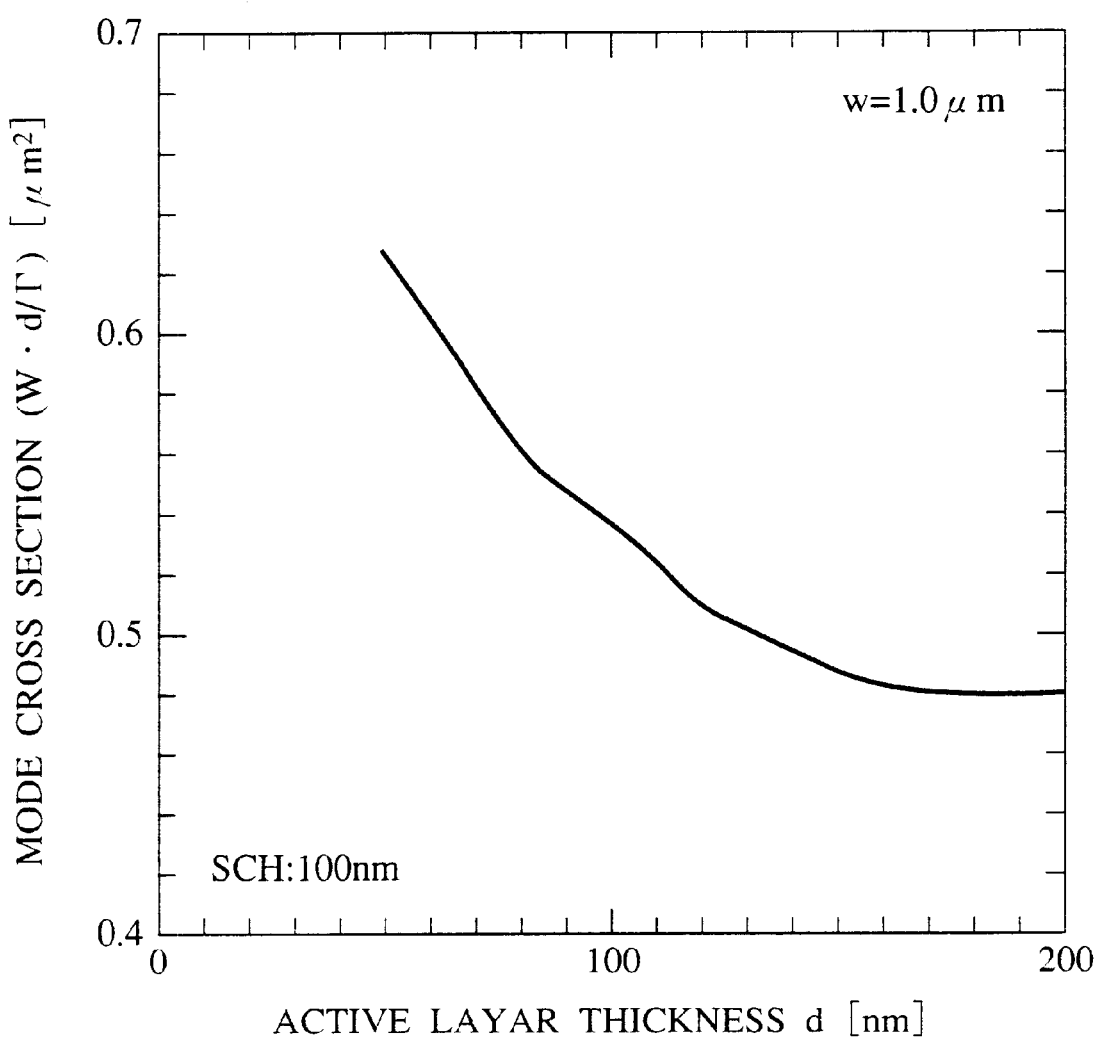
FIG. 2 is a graph explaining active layer thickness dependence of mode cross sections.

FIG. 2 shows a computation result of the case that separate confinement heterostructure layers of a 1.2 μm composition ($\lambda_g$=1.2 μm) and a 100 nm-thick is used, and an active layer width w is constantly 1.0 μm. As apparent in FIG. 2, it is understood that as an active layer thickness is made as thin as possible, whereby a larger mode cross section can be obtained. The increase of the mode cross section is outstanding especially when the active layer thickness d is below 100 nm.

Then, the above-stated (2) decreasing a carrier lifetime $\tau$ will be discussed. A carrier lifetime $\tau$ is expressed by $$\tau=1/(A+BN+CN^2)$$

where N is a carrier density, A is a non-light emitting recombination factor, B is a light emitting recombination factor, and C is an Auger recombination factor. It is found that a carrier lifetime $\tau$ decreases as a carrier density N increases.

Figure 3:
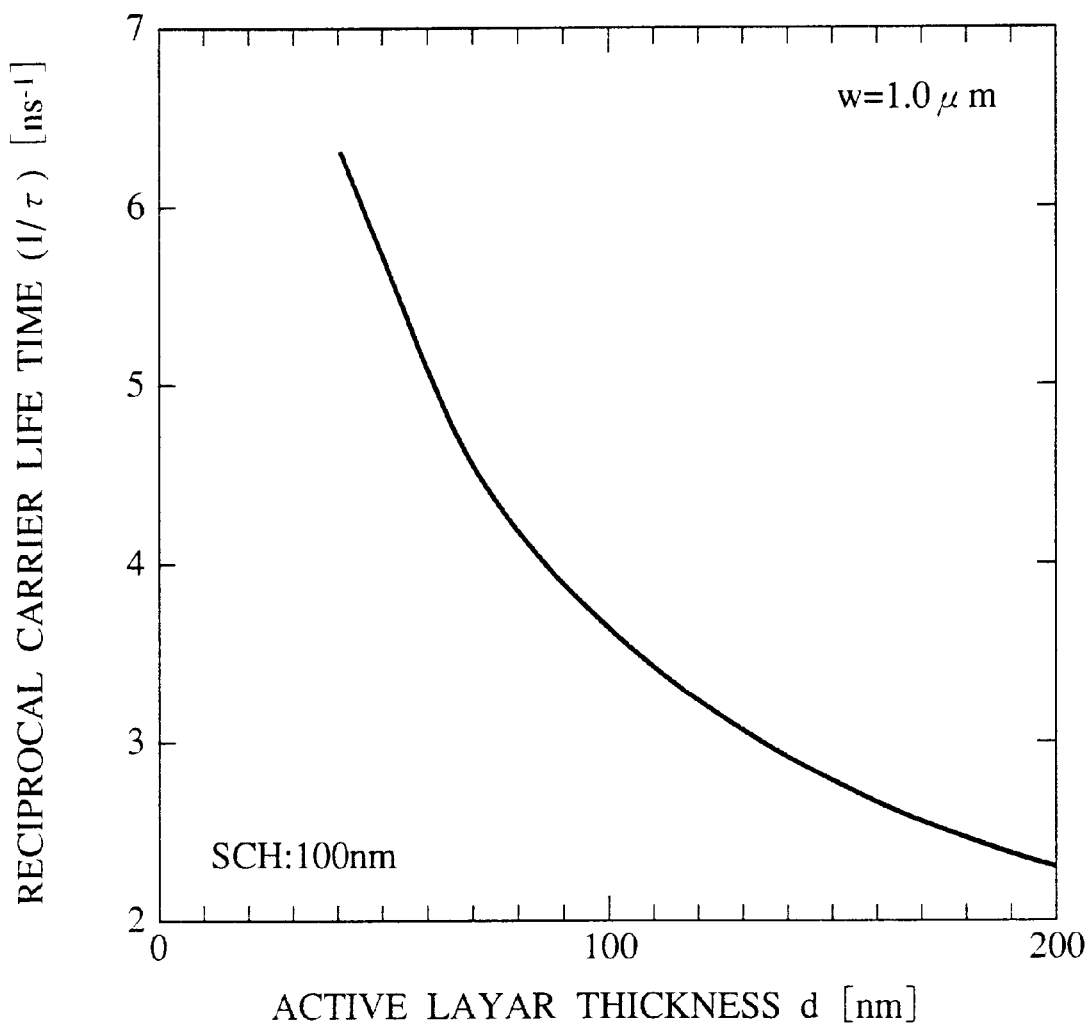
FIG. 3 is a graph explaining active layer thickness dependence of carrier life time.

When the device is operated with injected current set constant, a carrier density N increases as the active layer is thinned, and a carrier lifetime $\tau$ decreases. The result of computation of the active layer thickness dependence of reciprocal carrier lifetimes with an active layer thickness being 1.0 μm, a device length being 900 μm, and injected current being 400 mA constant is shown in FIG. 3. As apparent in FIG. 3, it is found that a carrier lifetime $\tau$ can be decreased by thinning the active layer.

Then, the above-stated (3) the active layer thickness dependence of differential gains will be discussed. In semiconductor optical amplifiers, a signal light wavelength $\lambda_s$ is used so as to be nearer to the long wavelength side than a gain peak wavelength $\lambda_p$, so as to increase an output saturation power and decrease a noise factor. Generally, the differential gain a is smaller as ($\lambda_s-\lambda_p$) is larger. Accordingly, in order to decrease a differential gain a, it is preferable to shorten $\lambda_p$ as much as possible in a range that a required gain can be provided. As described above, as a thickness d of the active layer is decreased, a carrier density N increases. When a carrier density N increases, a gain peak wavelength $\lambda_p$ shifts to a short wavelength side due to the band filling effect. As a result, ($\lambda_s-\lambda_p$) becomes larger, and a differential gain a can be decreased. Thus, it is found that the active layer is thinned to thereby decrease a differential gain.

Figure 4:
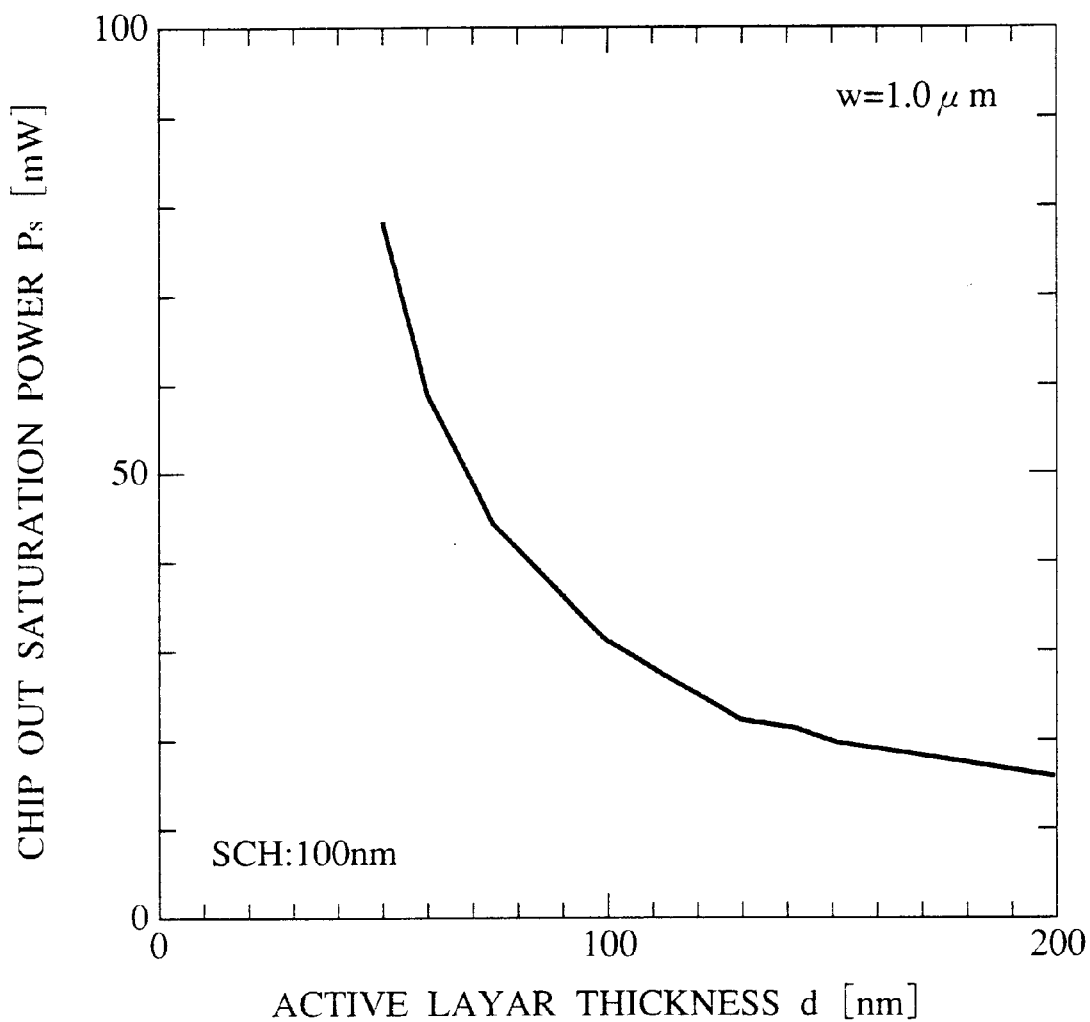
FIG. 4 is a graph explaining active layer thickness dependence of chip out saturation power.

Based on what has been described above, it can be expected that the active layer is thinned, mode cross section increase, carrier lifetime decrease and differential gain decrease synergistically act with each other, and much output saturation power increase can be expected. FIG. 4 shows a result of computation of active layer thickness dependence of chip out saturation power $P_s$. As apparent in FIG. 4, when an active layer thickness d is below 100 nm, increase of output saturation power $P_s$ becomes conspicuous. In order to obtain an output saturation power $P_s$ more than twice that for the conventional 200 nm-active layer thick, it is preferable that an active layer thickness d is below 90 nm.

As output light coupling to optical fibers, output power of above 10 $dB_m$ (about 10 mW) is preferable. In order to obtain an about 10 $dB_m$ optical output in an unsaturated state, an output saturation power of about 13 $dB_m$ (about 20 mW) is required. Taking into account coupling loses between the amplifier and the optical fiber of 3 dB, it is necessary to ensure an about 16 $dB_m$ (about 40 mW) chip out saturation power. In order to obtain a chip out saturation power of above about 16 $dB_m$, it is preferable that the active layer is above about 80 nm as shown in FIG. 4.

Figure 5:
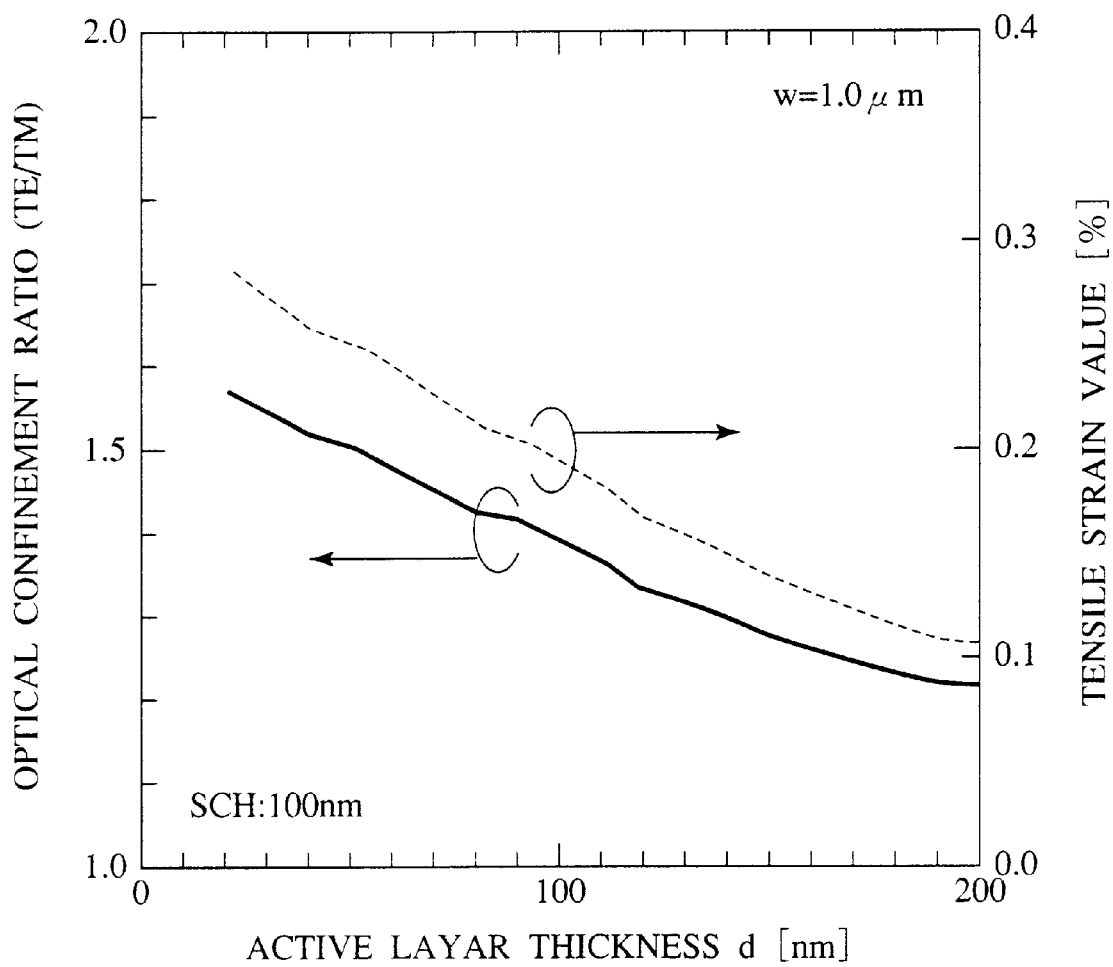
FIG. 5 is a graph explaining active layer thickness dependence of optical confinement ratios and tensile strain values required for canceling the ratios.

On the other hand, as the strained bulk active layer 3 is thinned and has higher flatness of the sectional shape, optical confinement ratio between TE and TM polarization lights becomes high, and a strain amount necessary for the polarization independency is increased. Active layer thickness d dependence of optical confinement ratio and tensile strain amount necessary to cancel the ratio were computed. A result of the computation is shown in FIG. 5. In this calculation, the separate confinement heterostructure layers 2 is set as 100 nm-thick and 1.2 μm composition ($\lambda_g$=1.2 μm).

As apparent in FIG. 5, as an active layer thickness d is decreased, an optical confinement ratio between TE and TM polarization lights is increased. It is understood that as a result, a tensile strain amount necessary to cancel the ratio is increased. It is considered that the optical confinement ratio between TE and TM polarization lights can be canceled by an about −0.3% strain amount up to an about 10 nm-active layer thickness d.

However, in a range which the quantum effect becomes conspicuous by decreasing the active layer thickness d, a material gain for the TE polarization light is increased, and a larger strain amount is necessary. To this end, it is necessary that a lower limit of the active layer thickness is set in a range where the quantum effect is not increased. Generally, the quantum effect becomes noticeable when a active layer thickness d is below about 20 nm. It is preferable that an active layer thickness d is set to be above about 20 nm.

As a measure of intensity of the quantum effect, an energy level difference $\Delta E_{c01}$ between energy $E_{c0}$ of the ground level in the conduction band of the quantum well and energy $E_{c1}$ of the first level therein is considered, and when an energy level difference becomes equal to or below thermal excitation energy kT, the quantum effect becomes less intense, and the active layer is judged to be bulk.

Figure 6:
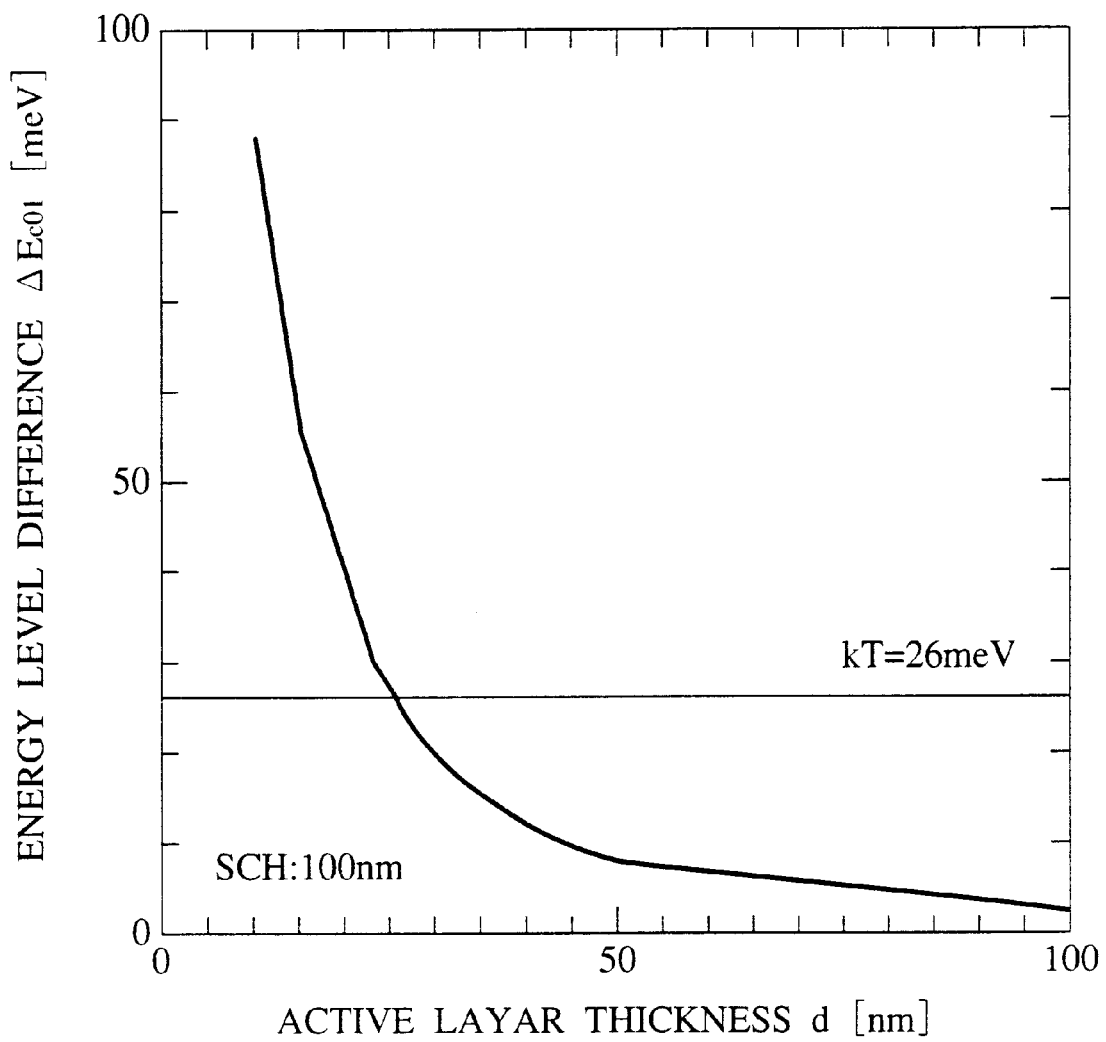
FIG. 6 is a graph explaining active layer thickness dependence of energy level differences $\Delta E_{c01}$ in InGaAsP/InP system.

FIG. 6 shows a result of computation of active layer thickness dependence of the energy level difference $\Delta E_{c01}$ in the InGaAsP/InP system. As shown in FIG. 6, as the active layer becomes thinner, the energy level difference $\Delta E_{c01}$ becomes smaller to be below a thermal excitation energy kT. A thickness of the active layer which makes an energy level difference $\Delta E_{c01}$ equal to or below a thermal excitation energy kT depends on a composition of the barrier layer, and is about 25 nm as shown when the active layer is formed of InGaAs layer and the barrier layer has a 1.2 μm InGaAsP composition.

A lower limit of the active layer thickness can be suitably determined in accordance with a material group and a layer structure, based on the above-described relationship between the energy level difference and the active layer thickness. In order to prevent the influence of the quantum effect without failure and to mitigate conditions for the tensile strain amount, it is preferable that an active layer thickness d is above about 30 nm.

In a case of the InGaAsP/InP system, when an active layer thickness d is 25 nm, an upper limit of the strain amount is about −0.45%, and when an active layer thickness d is 30 nm, an upper limit of the strain amount is about −0.44%.

Then, a diagrammatic structure of the polarization independent-type semiconductor optical amplifier according to the embodiment of the present invention fabricated based on the above-described preambles will be explained with reference to FIGS. 7 and 8.

Figure 7:
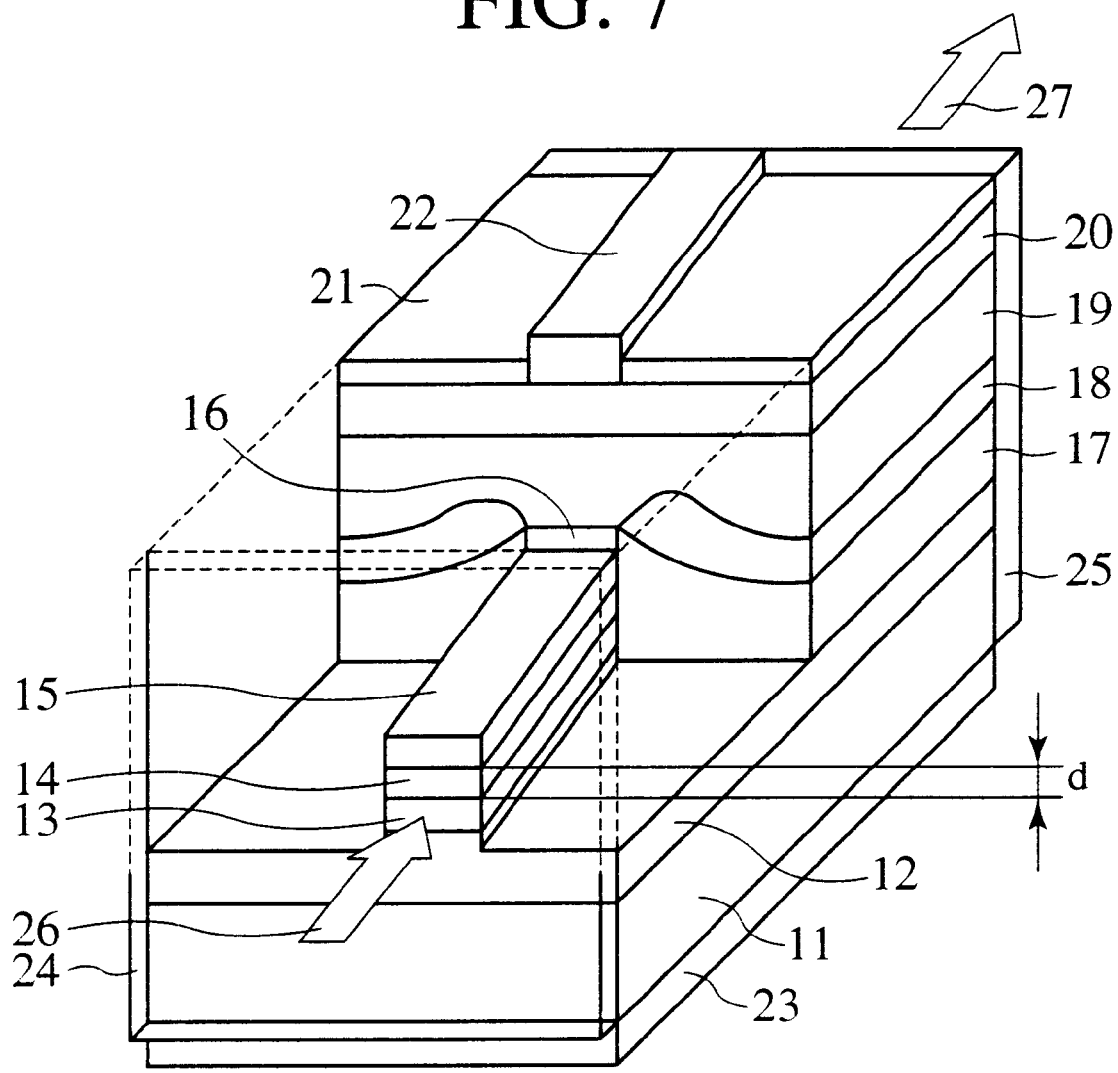
FIG. 7 is a diagrammatic perspective view of the polarization independent-type semiconductor optical amplifier according to one embodiment of the present invention (Part 1).
Figure 8:
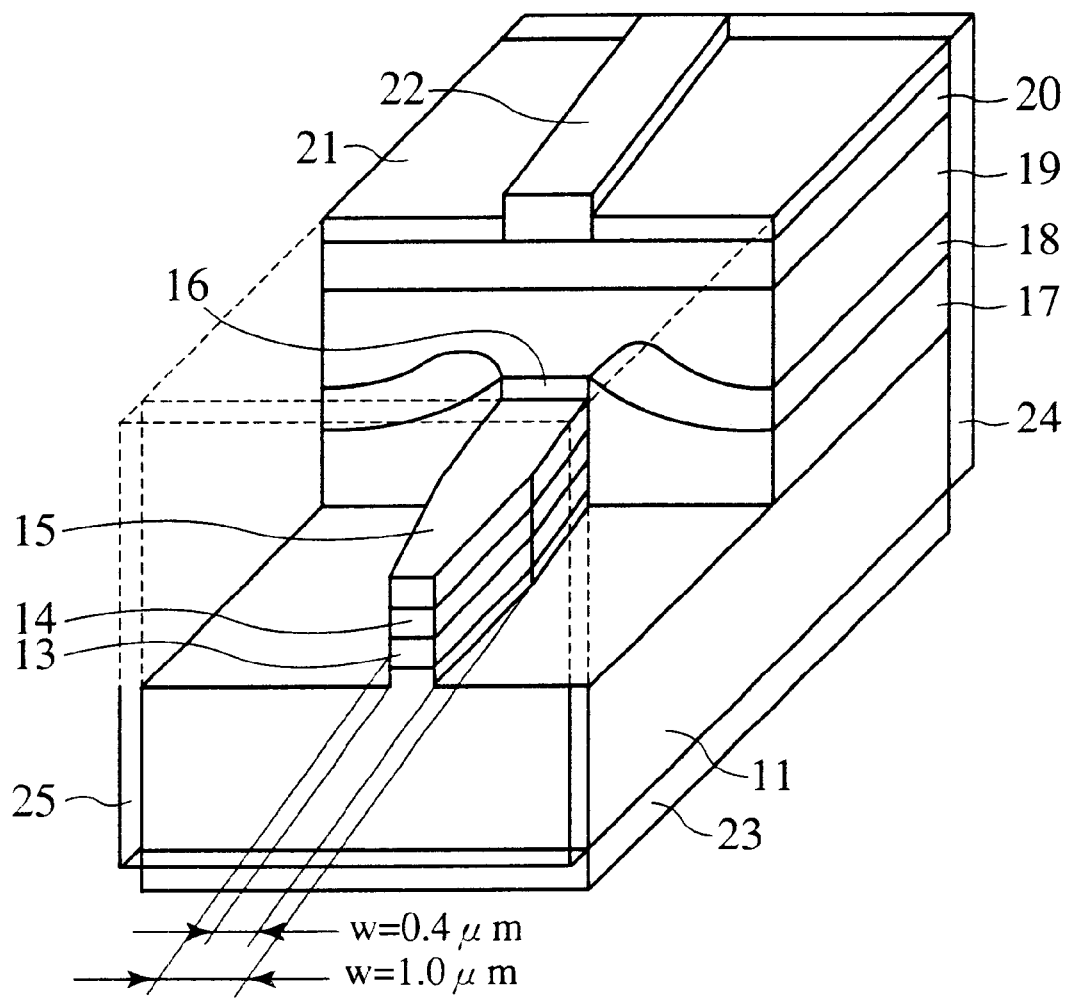
FIG. 8 is a diagrammatic perspective view of the polarization independent-type semiconductor optical amplifier according to one embodiment of the present invention (Part 2).

FIGS. 7 and 8 are diagrammatic perspective views of the polarization independent-type semiconductor optical amplifier according to the present invention. In the forward half of the drawings, a p-type InP current blocking layer 17, an n-type InP current blocking layer 18, p-type InP clad layers 16, 19, a p-type InGaAs contact layer 20, an SiO$_2$ film 21 and a p-side electrode 22 are omitted so as to show a structure of the active layer.

First, an n-type InP buffer layer 12 of, e.g., a 300 nm-thick, an InGaAsP separate confinement heterostructure layer 13 of, e.g., a 100 nm-thick and a 1.2 μm composition, an InGaAsP strained bulk active layer 14 of a −0.19%~−0.30% tensile strain amount, a 20 nm~100 nm-thick and a 1.60 μm-PL wavelength composition, an InGaAsP separate confinement heterostructure layer 15 of, e.g., a 100 nm-thick and a 1.2 μm-composition, and a p-type InP clad layer 16 are sequentially deposited on an n-type InP substrate 11 by MOCVD (Metal Organic Chemical Vapor Deposition) method.

The devices were fabricated with the InGaAsP strained bulk active layer 14 formed specifically in a 100 nm-thick, a 75 nm-thick and a 50 nm-thick, and with tensile strain amounts of −0.19%, −0.21% and −0.24% for the respective cases.

Then, an SiO$_2$ film is deposited on the entire surface and is patterned by lithography techniques using direct contact exposure and etching techniques into a stripe having the longitudinal axis tilted by 7–10°, e.g., 7° with respect to a vertical line of a face to be a cleavage plane, and a width of 0.6–1.4 μm, e.g., 1.0 μm. With this striped SiO$_2$ mask (not shown) as a mask, mesa etching is performed down to the n-type InP buffer layer 12 by reactive ion etching (RIE) using C$_2$H$_6$+H$_2$+O$_2$ gases, and a striped mesa having an active layer width of 0.6–1.4 μm, e.g., 1.0 μm is formed.

In this case, as shown in FIG. 8, in a completed device structure, an active layer width w was tapered over 200 μm to the light exit end face gradually from a 1.0 μm to 0.4 μm so as to obtain high optical coupling efficiency.

Then, a p-type InP current blocking layer 17 and an n-type InP current blocking layer 18 are selectively grown on the side walls of the striped mesa, using as a selective growth mask the SiO$_2$ mask as it is.

Next, the SiO$_2$ mask is removed, and then a p-type InP clad layer 19 and a p-type InGaAs contact layer 20 are sequentially deposited on the entire surface.

Next, an SiO$_2$ film is deposited on the entire surface, and an opening which is projected over the striped mesa is formed. Then, a p-side electrode 22 is formed on the p-type InGaAs contact layer 20, and an n-side electrode 23 is formed on the back side of the n-type InP substrate 11.

Then, the chip is cleaved along the cleavage plane and an antireflection coating films 24, 25 are deposited on the cleaved faces. Thus, the basic structure of the polarization independent-type semiconductor optical amplifier is completed.

This polarization independent-type semiconductor optical amplifier has the antireflection coating films 24, 25 on the cleaved faces, i.e., the light incident end face and the light exit end face, whereby light resonance due to reflection between the light incident end face and the light exit end face is depressed, and input optical signal of around 1.55-μm is amplified in the InGaAsP strained bulk active layer 14 by stimulated emission effect and exits at the light exit end face as amplified output light.

Next, operational effects of the embodiment of the present invention will be explained with reference to FIGS. 9 to 13.

Figure 9:
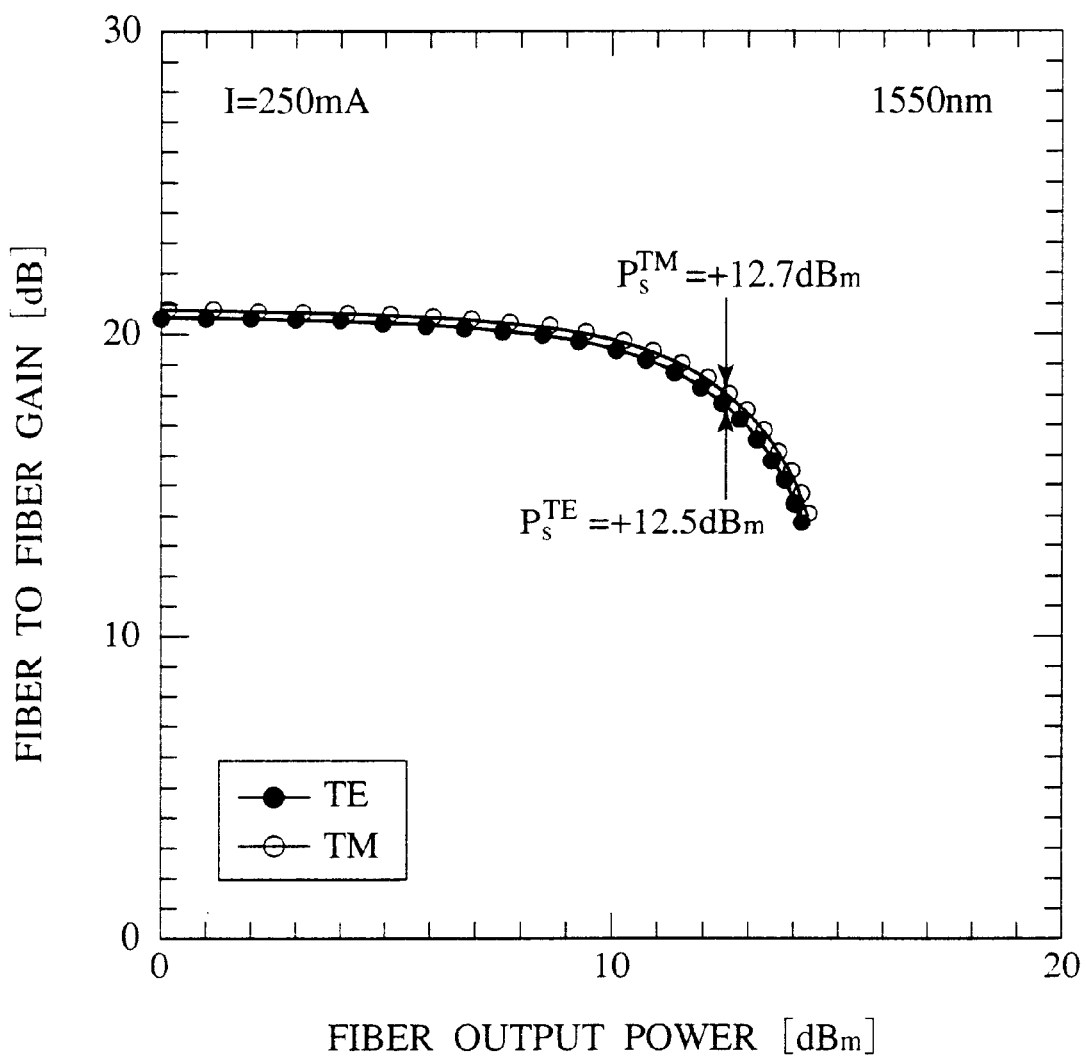
FIG. 9 is a graph of fiber to fiber gain—fiber output power characteristics of the embodiment having an active layer thickness d of 100 nm.
Figure 10:
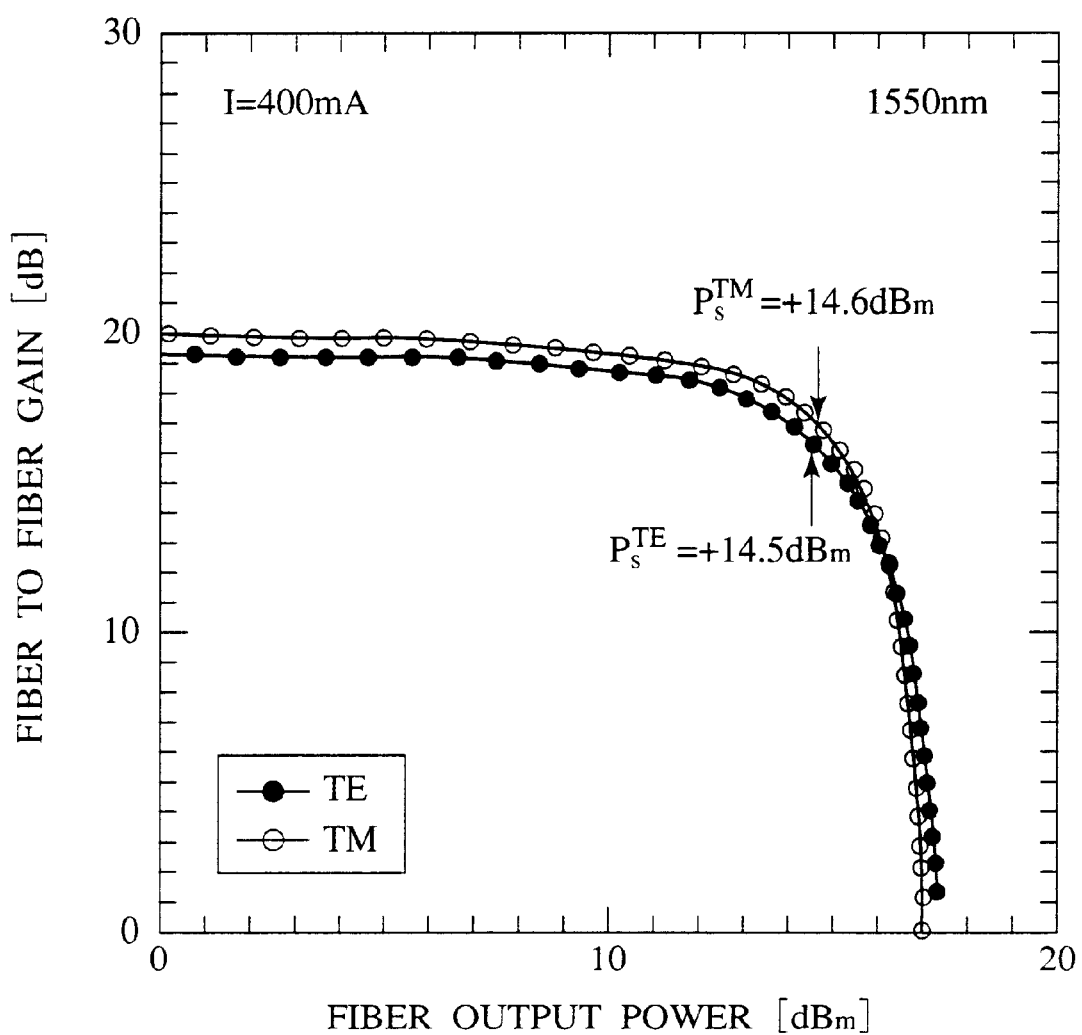
FIG. 10 is a graph of fiber to fiber gain—fiber output power characteristics of the embodiment having an active layer thickness d of 75 nm.
Figure 11:
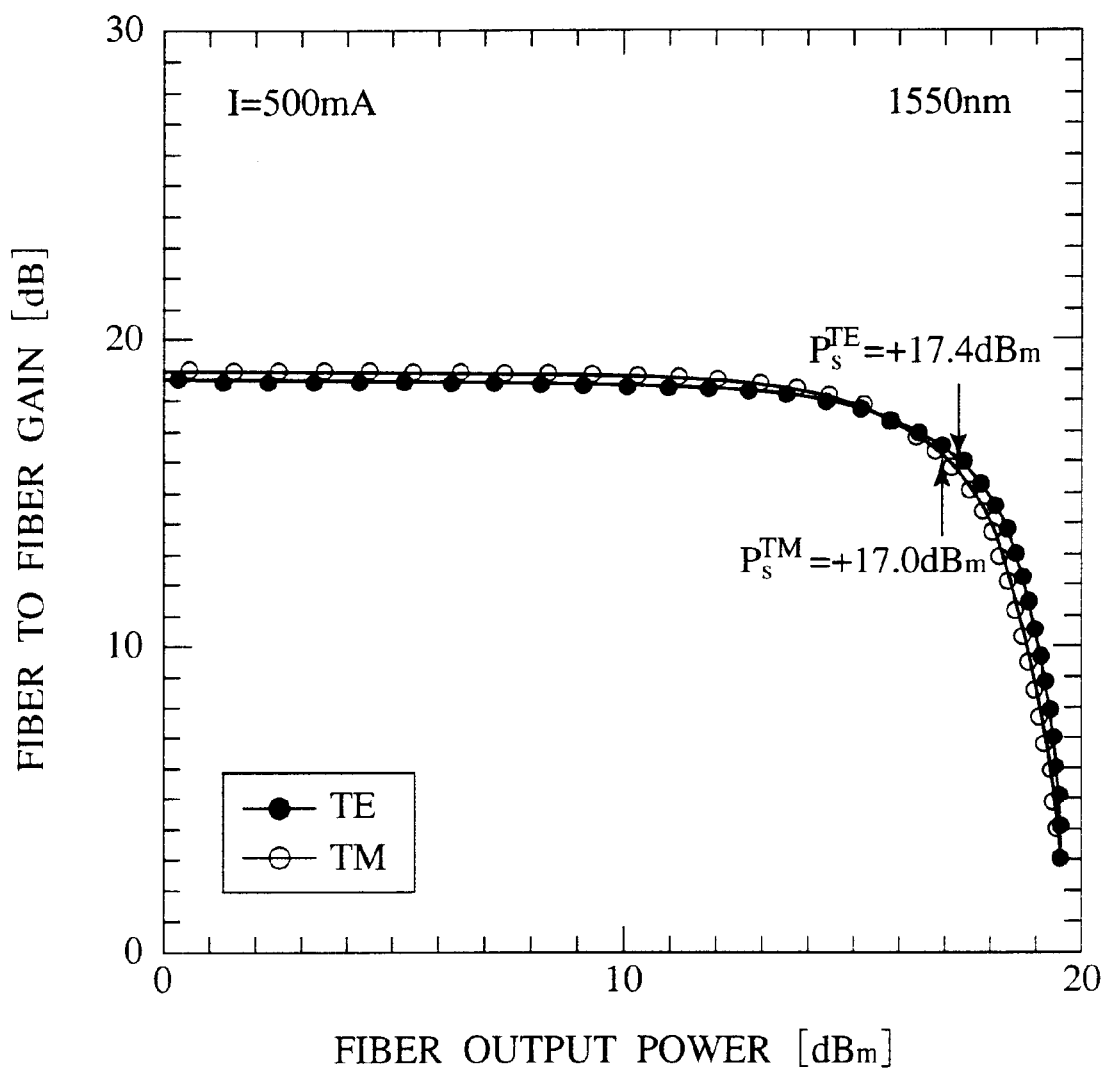
FIG. 11 is a graph of fiber to fiber gain—fiber output power characteristics of the embodiment having an active layer thickness d of 50 nm.

In the evaluation shown in FIGS. 9 to 11, the devices of three kinds having active layer thicknesses different from each other have the device lengths adjusted so that the respective devices have fiber to fiber gains of 19–21 dB at substantially constant current density. That is, for the 100 nm-thick active layer thickness, a device length is 600 μm and current is 250 mA; for the 75 nm-thick active layer thickness, a device length is 900 μm, and current is 400 mA; and for the 50-nm thick active layer, a device length is 1200 μm, and current is 500 mA. An active layer width is 1.1–1.4 μm.

FIG. 9 shows fiber to fiber gain—fiber output power characteristics for the InGaAsP strained bulk active layer 14 of a 100 nm-thick. In FIG. 9, the ○ mark indicates data for TM polarization light, and $P_s^{TM}$ represents data for TM polarization light. The ● mark in the drawing indicates data for TE polarization light, and $P_s^{TE}$ represents data for TE polarization light. A fiber output power at the time when a fiber to fiber gain is decreased by 3 dB is to be a fiber out saturation power.

As apparent in FIG. 9, as a fiber output power is increased, a fiber to fiber gain decreases. For a maximum value about 21 dB of the fiber to fiber gain, fiber out saturation powers which have been decreased by 3 dB were +12.5 dB$_m$ for TE polarization light and +12.7 dB$_m$ for TM polarization light.

In this case, an inter-polarization gain difference is within 0.5 dB.

FIG. 10 shows fiber to fiber gain—fiber output power characteristics for the InGaAsP strained bulk active layer 14 of a 75 nm-thick. In FIG. 10, the ○ mark indicates data for TM polarization light, and $P_s^{TM}$ represents data for TM polarization light. The ● mark in the drawing indicates data for TE polarization light, and $P_s^{TE}$ represents data for TE polarization light. A fiber output power at the time when a fiber to fiber gain is decreased by 3 dB is to be a fiber out saturation power.

As apparent in FIG. 10, as a fiber output power is increased, a fiber to fiber gain decreases. For a maximum value about 20 dB of the fiber to fiber gain, fiber out saturation powers which have been decreased by 3 dB were +14.5 dB$_m$ for TE polarization light and +14.6 dB$_m$ for TM polarization light.

In this case, an inter-polarization gain difference is within 0.5 dB.

FIG. 11 shows fiber to fiber gain—fiber output power characteristics for the InGaAsP strained bulk active layer 14 of a 50 nm-thick. In FIG. 11, the ○ mark indicates data for TM polarization light, and $P_s^{TM}$ represents data for TM polarization light. The ● mark in the drawing indicates data for TE polarization light, and $P_s^{TE}$ represents data for TE polarization light. A fiber output power at the time when a fiber to fiber gain is decreased by 3 dB is to be a fiber out saturation power.

As apparent in FIG. 11, as a fiber output power is increased, a fiber to fiber gain decreases. For a maximum value about 19 dB of the fiber to fiber gain, fiber out saturation powers which have been decreased by 3 dB were +17.4 dB$_m$ for TE polarization light and +17.0 dB$_m$ for TM polarization light.

In this case, an inter-polarization gain difference is within 0.5 dB.

Figure 12:
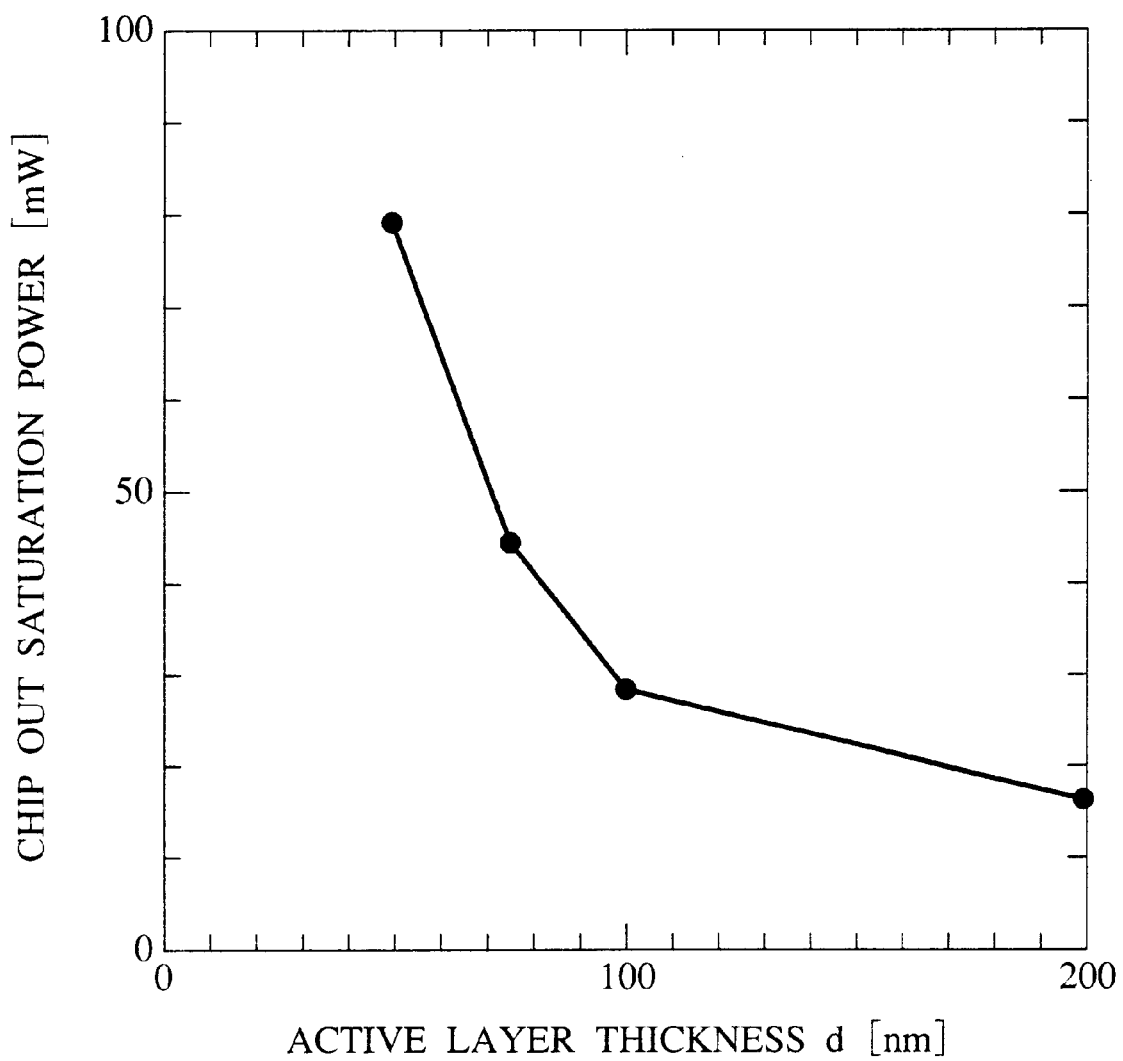
FIG. 12 is a graph explaining active layer thickness dependence of chip out saturation powers of the embodiment of the present invention.

FIG. 12 shows active layer thickness dependence of chip out saturation powers of the device according to the present invention and of Alcatel device using a tensile strained bulk active layer of a 200 nm-thick, which has the best record of the conventional fiber out saturation power. The chip out saturation powers were values estimated based on measured fiber out saturation powers and in consideration of fiber coupling efficiency.

As apparent in FIG. 12, it was confirmed that the device according to the present invention can provide larger chip out saturation powers by thinning the active layer than the conventional device.

Figure 13:
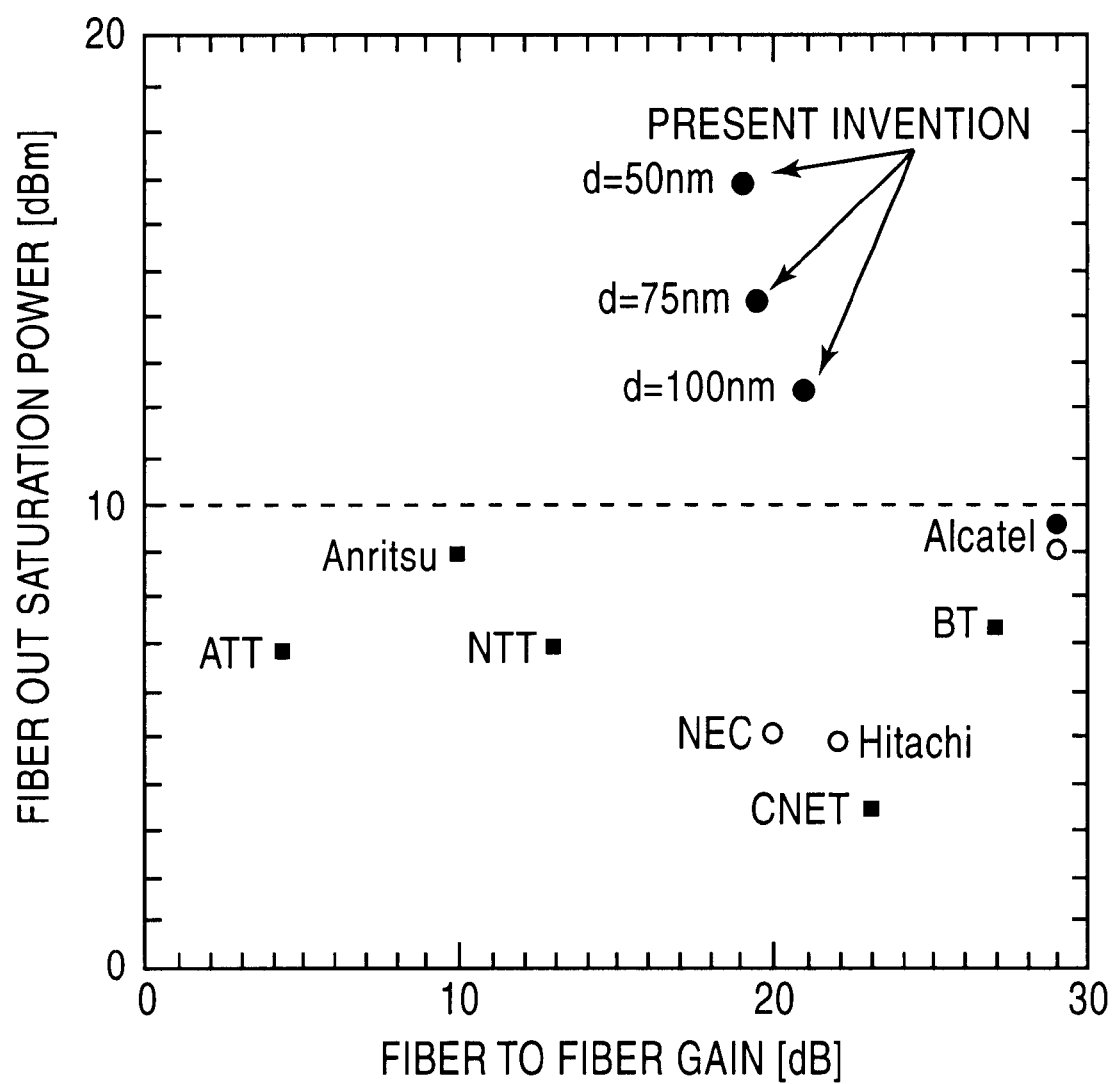
FIG. 13 is a graph explaining fiber out saturation powers and fiber to fiber gains of the 1.55 μm-band polarization independent-type semiconductor optical amplifiers.
Figure 14:
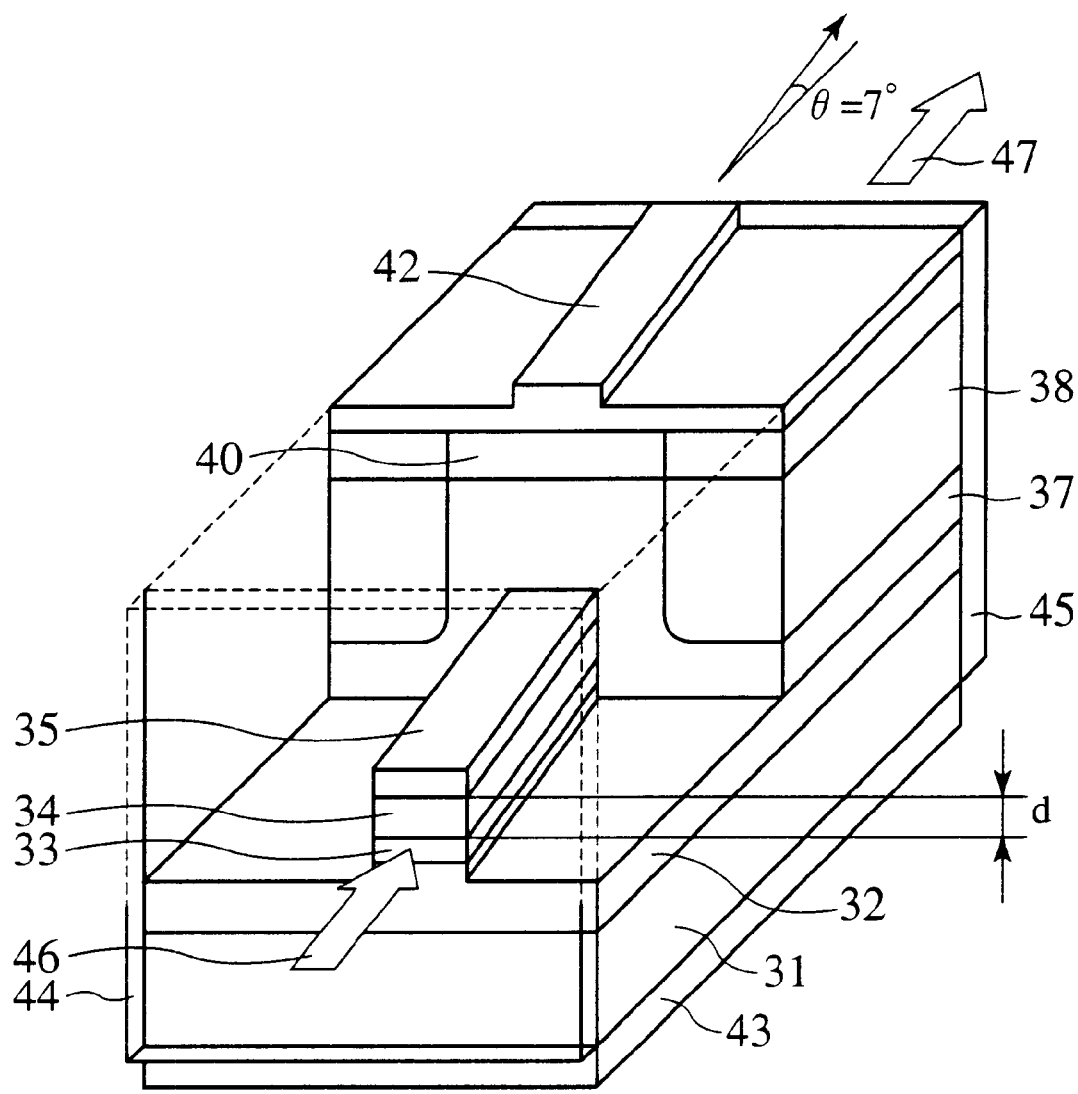
FIG. 14 is a diagrammatic perspective view of the conventional polarization independent-type semiconductor optical amplifier.

The above-described results are shown in TABLEs 1 and 2 together with characteristics of the above-described conventional polarization independent-type semiconductor optical amplifiers. Out of the characteristics, FIG. 13 plots the fiber out saturation powers and the fiber to fiber gains. For the convenience of preparing the specification, one table is divided in TABLES 1 and 2 as shown.

TABLE 1

|  | Constitution of Active Layer | Thickness of Active Layer (nm) | Width of Active Layer (μm) | Device Length (μm) |
|---|---|---|---|---|
| Alcatel$_1$ | Non-Strained Bulk Layer | 430 | 0.5 | 800 |
| NTT | Strained MQW | | | 660 |
| BT | Strained MQW | | | 2000 |
| ATT | Strained MQW | | | 625 |
| CNET | Strained MQW | | | 940 |
| Alcatel$_2$ | Strained bulk layer | 200 | 1.2 | 1000 |
| Hitachi | Non-Strained Bulk Layer | 300 | 0.4 | 600 |
| Anritsu | Strained MQW | | | 660 |
| Present Invention$_1$ | Strained Bulk Layer | 100 | 1.1–1.4 | 600 |
| Present Invention$_2$ | Straine Bulk Layer | 75 | 1.1–1.4 | 900 |
| Present Invention$_3$ | Strained Bulk Layer | 50 | 1.1–1.4 | 1200 |

TABLE 2

|  | Inter-polarization Gain (dB) | Fiber to Fiber Gain (dB) | Fiber Out Saturation Power (dBm) |
|---|---|---|---|
| Alcatel$_1$ | below 0.5 | 29 | +9.0 |
| NTT | below 1.0 | (13) | (+7.0) |
| BT | below 0.5 | 27 | +7.5 |
| ATT | below 1.0 | (4.4) | (+6.8) |
| CNET | below 1.0 | 23 | (+3.5) |
| Alcatel$_2$ | below 0.3 | 29 | +9.5 |
| Hitachi | below 1.0 | 22 | +5.0 |
| Anritsu | below 0.5 | 10 | +9.0 |
| Present Invention$_1$ | below 0.5 | 21 | +12.5 |
| Present Invention$_2$ | below 0.5 | 20 | +14.5 |
| Present Invention$_3$ | below 0.5 | 19 | +17.0 |

As apparent in FIG. 13, the device according to the present invention is superior to Alcatel$_2$, which has the conventional best fiber out saturation power record, by 3 (+12.5 dB$_m$)~7 dB (+16.5 dB$_m$) in the fiber out saturation power. The constitution of the device according to the present invention could made the best record.

Accordingly, it is understood that thinning the tensile strained bulk active layer is every effective to obtain high output saturation power.

In the fiber to fiber gain, Alcatel et al. is superior to the device according to the present invention. However, a fiber to fiber gain depends on a device length of the semiconductor optical amplifier, and the fiber to fiber gain can be optionally increased by increasing a device length with a higher fiber out saturation power retained. The shown result is due to the device length difference between the devices.

As explained above, the tensile strained bulk active layer has a 20 nm–100 nm-thick, whereby a chip out saturation power, accordingly a fiber out saturation power could be increased by 3–7.5 dB than the conventional highest value. A tensile strain amount required to retain polarization independence, which is increased by higher optical confinement ratio accompanying thinning the active layer can be depressed to the value of the sufficiently practical level. Output saturation power increase and polarization independence, which have been considered incompatible with each other, can be made compatible.

An embodiment of the present invention has been explained above, but the present invention is not limited to the constitution and conditions of the above-described embodiment. The present invention covers other various modifications.

For example, in the above-described embodiment, the active layer has a width w tapered toward the light exit end face on the side of the light exit end face, but may retain, on the side of the light exit end face, the same width as a width of the active layer at the central part of the device.

In the above-described embodiment, the active layer has a thickness d which is constant. The active layer may have a thickness d tapered, on the light exit end face side, to the light exit end face to have a thickness which is below $1/2$, e.g., $1/3$ of a thickness of the active layer at the central part of the device. Such thinning may be used together with the above-described tapering decrease of an active layer width.

In the above-described embodiment, the active layer reaches the light exit end face. However, it is possible that the active layer and the separate confinement heterostructure layer on the light exit end face side are removed in a 20–50 µm range to leave the clad layer alone so as to form a so-called window structure. The window structure can more reduce reflection of light on the light exit end face. Prevention of generation of ripples in outputs can be ensured.

In a case, for example, that a 30 dB gain of a system is required, ripples will take place unless a residual reflectance at the end face is below about $10^{-5}$, and the use of such window structure is effective.

In the above-described embodiment, the n-type InP buffer layer is the n-type clad layer. However, it is possible that in place of providing the n-type InP buffer layer, the InGaAsP separate confinement heterostructure layer and the InGaAsP strained active layer are grown directly on the n-type InP substrate to use the n-type InP substrate as the n-type clad layer.

In the above-described embodiment, the n-type and p-type current blocking layers are provided on the sides of the striped mesa to narrow current. However, known means for narrowing current, e.g., an Fe-doped InP high resistance layer or others, may be used.

According to the present invention, the active layer has a thickness of 20–100 nm, whereby drastically increased fiber out saturation powers can be obtained with polarization independence retained. As a result, wide input dynamic ranges can be obtained. Accordingly, the polarization independent-type semiconductor optical amplifier according to the present invention can be one that can accommodate high power level changes of input optical signals. Accordingly, the polarization independent-type semiconductor optical amplifier according to the present invention much contributes to practice of wavelength division multiplexing optical communication systems.

What is claimed is:

1. A polarization independent-type semiconductor optical amplifier comprising:

a strained bulk active layer having a 20 nm to 90 nm-thick and having an uniform composition and an uniform tensile strain value of 0.10% to 0.60%;

clad layers provided, sandwiching the strained bulk active layer; and a resonance suppressing means for suppressing resonance of light due to reflection on a light incident end face and a light exit end face of the strained bulk active layer, wherein incident signal light entering at the light incident end face is amplified and emitted at the light exit end face as an exit signal light, and a gain of the exit signal light is substantially constant independent of a polarization state of the incident signal light.

2. A polarization independent-type semiconductor optical amplifier according to claim 1, further comprising: separation confinement heterostructure layers provided between the strained bulk active layer and the clad layers.

3. A polarization independent-type semiconductor optical amplifier according to claim 1, wherein a width of the strained bulk active layer is gradually reduced toward the light incident end face and/or the light exit end face.

4. A polarization independent-type semiconductor optical amplifier according to claim 1, wherein a thickness of the strained bulk active layer is gradually reduced toward the light incident end surface and/or the light exit end surface.

5. A polarization independent-type semiconductor optical amplifier according to claim 1, wherein an axial direction of the strained bulk active layer is tilted to a normal direction of the light exit end face.

6. A polarization independent-type semiconductor optical amplifier according to claim 1, wherein the strained bulk active layer is not formed near the light incident end surface and/or the light exit end surface, and the strained bulk active layer has the end face covered with the clad layers.

* * * * *